(12) United States Patent
Kasahara

(10) Patent No.: US 6,340,832 B2
(45) Date of Patent: Jan. 22, 2002

(54) MIM CAPACITOR HAVING REDUCED CAPACITANCE ERROR AND PHASE ROTATION

(75) Inventor: Tomokazu Kasahara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/817,045

(22) Filed: Mar. 27, 2001

(30) Foreign Application Priority Data

Mar. 28, 2000 (JP) ...................................... 2000-089634

(51) Int. Cl.⁷ .............................................. H01L 29/00
(52) U.S. Cl. ........................ 257/532; 257/306; 257/310; 257/535
(58) Field of Search ................................. 257/306, 310, 257/532, 535

(56) References Cited

U.S. PATENT DOCUMENTS

| | | | |
|---|---|---|---|
| 5,083,184 A | * 1/1992 | Eguchi ........................ | 257/532 |
| 5,565,699 A | * 10/1996 | Kaneko et al. .............. | 257/379 |
| 5,627,391 A | * 5/1997 | Shimada et al. ............ | 257/310 |
| 5,670,808 A | * 9/1997 | Nishihori et al. ........... | 257/310 |
| 5,721,700 A | * 2/1998 | Katoh ......................... | 257/296 |
| 5,818,079 A | * 10/1998 | Noma et al. ................. | 257/310 |
| 6,144,051 A | * 11/2000 | Nishimura et al. ......... | 257/306 |
| 6,169,304 B1 | * 1/2001 | Arita et al. ................. | 257/535 |

FOREIGN PATENT DOCUMENTS

| | | |
|---|---|---|
| JP | 58-159367 | 9/1983 |
| JP | 62-58531 | 12/1987 |
| JP | 4-326568 | 11/1992 |
| JP | 6-132490 | 5/1994 |
| JP | 10-242388 | 9/1998 |

* cited by examiner

Primary Examiner—Gene M. Munson
(74) Attorney, Agent, or Firm—Foley & Lardner

(57) ABSTRACT

An Metal Insulator Metal (MIM) capacitor having improved performance in a high frequency range. The MIM capacitor comprises: a lower electrode; a second insulating film formed on the lower electrode; a capacitor insulating film formed on a portion of the lower electrode; an upper electrode formed on the capacitor insulating film; a third insulating film formed on the second insulating film and the upper electrode; a first lead electrode which connects to a portion of the lower electrode; a second lead electrode which connects to a portion of the upper electrode. The first lead electrode is continuously formed such that the first electrode surrounds at least three sides of the capacitor insulating film, and the width H of the capacitor insulating film and maximum frequency F satisfy the formula: $H<(A/F)^{1/2}$, where, A is a predetermined constant determined depending on a structure and manufacturing process of the MIM capacitor to obtain desired admittance characteristics.

10 Claims, 3 Drawing Sheets

MIM CAPACITOR HAVING REDUCED CAPACITANCE ERROR AND PHASE ROTATION

FIELD OF THE INVENTION

The present invention relates generally to a Metal Insulator Metal (MIM) capacitor for a semiconductor integrated circuit device. More particularly, the present invention relates to such MIM capacitor and a method of manufacturing the same in which a capacitance error and phase rotation in a high frequency can be reduced.

BACKGROUND OF THE INVENTION

Conventionally, as a capacitor for a semiconductor integrated circuit device, there is known a Metal Oxide Semiconductor (MOS) capacitor. The MOS capacitor is manufactured as follows. First, a diffusion layer is formed in a semiconductor substrate which layer is also used as a lower electrode of the capacitor. Then, a dielectric layer is deposited on the diffusion layer and patterned. An upper electrode is then formed on the dielectric layer, and an oxide layer is formed on whole area of the semiconductor substrate. Thereafter, rectangular shaped openings for contacting the upper and lower electrodes are formed in predetermined locations of the oxide layer. A metal film made of aluminum and the like is formed on the oxide layer such that the openings are filled with the material of the metal film, and the metal film is then patterned. In this way, the conventional MOS capacitor is fabricated.

In the conventional MOS capacitor, when a high frequency signal is applied to it, a relatively large phase rotation occurs due to internal resistance of the MOS capacitor and, thereby, admittance is decreased. In Japanese patent laid-open publication No. 58-159367, comb-shaped capacitor contacts are used to avoid such disadvantage.

However, in the MOS capacitor disclosed in Japanese patent laid-open publication No. 58-159367, although the capacitor contacts each having a comb shape are used, a way of contacting the capacitor electrodes and an effective width of the capacitor are not optimized. Therefore, even in this capacitor, when a high frequency signal is applied thereto, an admittance of the capacitor is decreased.

SUMMARY OF THE INVENTION

Therefore, it is an object of the present invention to obviate the disadvantages of the conventional MIM capacitor for a semiconductor integrated circuit device.

It is another object of the present invention to provide an MIM capacitor for a semiconductor integrated circuit device in which admittance reduction when a high frequency signal is applied to the capacitor can be suppressed.

It is still another object of the present invention to provide an MIM capacitor for a semiconductor integrated circuit device in which parasitic resistance of the capacitor can be decreased.

It is still another object of the present invention to provide an MIM capacitor for a semiconductor integrated circuit device in which a way of contacting the electrodes of the capacitor and a width of the capacitor are optimized.

It is still another object of the present invention to provide an MIM capacitor for a semiconductor integrated circuit device in which capacitance error and phase rotation in a high frequency can be reduced.

It is still another object of the present invention to provide an MIM capacitor for a semiconductor integrated circuit device in which circuit characteristics of the semiconductor integrated circuit device can be improved.

According to an aspect of the present invention, there is provided an MIM capacitor for a semiconductor integrated circuit device comprising: a semiconductor substrate; a first insulating film formed on the semiconductor substrate; a lower electrode formed on the first insulating film; a second insulating film formed on the lower electrode; a first opening which penetrates the second insulating film and which reaches the lower electrode; a capacitor insulating film formed on a portion of the lower electrode exposed by the first opening; an upper electrode formed on the capacitor insulating film; a third insulating film formed on the second insulating film and the upper electrode; a second opening which penetrates the second and third insulating films and which reaches the lower electrode; a first lead electrode which fills the second opening, which connects to a portion of the lower electrode exposed via the second opening, and which is drawn out onto the surface of the third insulating film; a third opening which penetrates the third insulating films and which reaches the upper electrode; and a second lead electrode which fills the third opening, which connects to a portion of the upper electrode exposed via the third opening, and which is drawn out onto the surface of the third insulating film; wherein first lead electrode is continuously formed such that the first electrode surrounds at least three sides of the capacitor insulating film, and the width of the capacitor insulating film satisfies the following formula:

$$H < (A/F)^{1/2}$$

where, H designates the width of the capacitor insulating film, A designates a predetermined constant determined depending on a structure and a manufacturing process of the MIM capacitor to obtain desired admittance characteristics, and F designates maximum frequency of a signal used by the MIM capacitor.

In this case, it is preferable that the first lead electrode is a U-shaped electrode.

It is also preferable that the first lead electrode is a comb-shaped electrode.

It is further preferable that the first lead electrode is continuously formed such that the first lead electrode surrounds all sides of the capacitor insulating film.

It is advantageous that the capacitor insulating film is made of a material selected from a group consisting of silicon oxide, silicon oxynitride and silicon nitride.

It is also advantageous that the capacitor insulating film is made of a high dielectric constant material.

It is further advantageous that the capacitor insulating film is made of a material selected from a group consisting of $PbZr_{1-x}Ti_xO_3$ ($0 \leq x \leq 1$), $Pb_{1-x}La_xZr_{1-y}Ti_yO_3$ ($0 \leq x \leq 1$, $0 \leq y \leq 1$), $BaTiO_3$, $Ba_{1-x}Sr_xTiO_3$ ($0 \leq x \leq 1$), and $SrTiO_3$.

It is preferable that the lower electrode and the upper electrode are made of polysilicon.

It is also preferable that the first and second lead electrodes are made of a material selected from a group consisting of aluminum, copper and gold.

It is further preferable that the first and second insulating films are made of silicon oxide, and the third insulating film is made of tetraethoxyorthosilicate.

According to another aspect of the present invention, there is provided a method of manufacturing an MIM capacitor for a semiconductor integrated circuit device comprising: preparing a semiconductor substrate; forming a first insulating film on the semiconductor substrate; forming a lower electrode on the first insulating film; forming a second insulating film on the lower electrode; forming a first opening by selectively removing the second insulating film, a portion of the lower electrode is exposed via the first opening; forming a capacitor insulating film on the portion of the lower electrode exposed by the first opening; forming an upper electrode on the capacitor insulating film; forming a third insulating film on the second insulating film and the upper electrode; forming a second opening by selectively removing the second and third insulating films, a portion of the lower electrode is exposed via the second opening; forming a third opening by selectively removing the third insulating film, a portion of the upper electrode is exposed via the third opening; forming a first lead electrode which fills the second opening, which connects to the portion of the lower electrode exposed via the second opening, and which is drawn out onto the surface of the third insulating film; and forming a second lead electrode which fills the third opening, which connects to the portion of the upper electrode exposed via the third opening, and which is drawn out onto the surface of the third insulating film; wherein, in the forming a second opening by selectively removing the second and third insulating films, the second opening is continuously formed such that the second opening surrounds at least three sides of the capacitor insulating film, and the width of the capacitor insulating film satisfies the following formula:

$$H<(A/F)^{1/2}$$

where, H designates the width of the capacitor insulating film, A designates a predetermined constant determined depending on a structure and a manufacturing process of the MIM capacitor to obtain desired admittance characteristics, and F designates maximum frequency of a signal used by the MIM capacitor.

It is preferable that the first lead electrode is a U-shaped electrode.

It is also preferable that the first lead electrode is a comb-shaped electrode.

It is further preferable that the first lead electrode is continuously formed such that the first lead electrode surrounds all sides of the capacitor insulating film.

It is advantageous that the capacitor insulating film is made of a material selected from a group consisting of silicon oxide, silicon oxynitride and silicon nitride.

It is also advantageous that the capacitor insulating film is made of a high dielectric constant material.

It is further advantageous that the capacitor insulating film is made of a material selected from a group consisting of $PbZr_{1-x}Ti_xO_3$ ($0 \leq x \leq 1$), $Pb_{1-x}La_xZr_{1-y}Ti_yO_3$ ($0 \leq x \leq 1$, $0 \leq y \leq 1$), $BaTiO_3$, $Ba_{1-x}Sr_xTiO_3$ ($0 \leq x \leq 1$), and $SrTiO_3$.

It is preferable that the lower electrode and the upper electrode are made of polysilicon.

It is also preferable that the first and second lead electrodes are made of a material selected from a group consisting of aluminum, copper and gold.

It is further preferable that the first and second insulating films are made of silicon oxide, and the third insulating film is made of tetraethoxyorthosilicate.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will now be described in detail.

Figure 1:
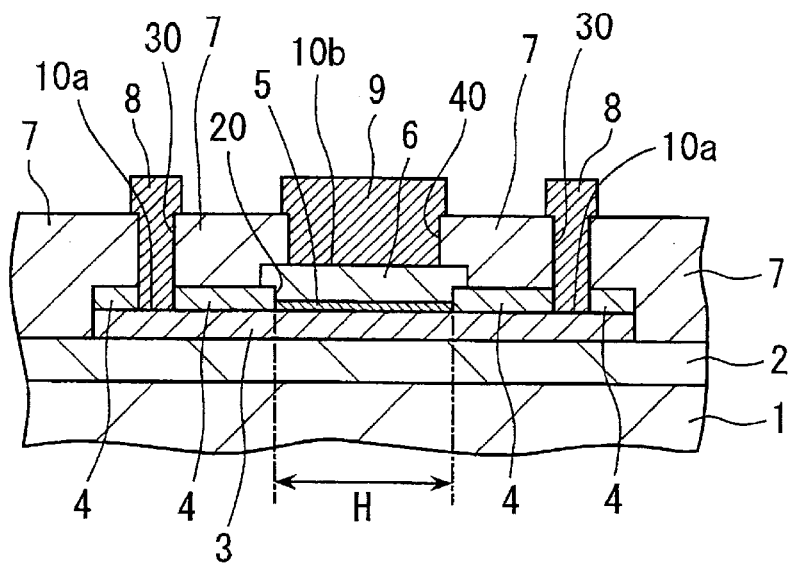
FIG. 1 is a schematic cross sectional view showing a structure of an MIM capacitor for a semiconductor integrated circuit device according to the first embodiment of the present invention.

FIG. 1 is a schematic cross sectional view showing a structure of an MIM capacitor according to the first embodiment of the present invention. The MIM capacitor according to the present embodiment comprises a semiconductor substrate 1, a first insulating film 2 formed on the semiconductor substrate 1, a lower electrode 3 formed on a portion of the first insulating film 2, and a second insulating film 4 formed on the lower electrode 3. The first insulating film 2 is made, for example, of silicon oxide such as silicon dioxide ($SiO_2$) and the like. The lower electrode 3 is made, for example, of a polysilicon film. The second insulating film 4 is made, for example, of silicon oxide such as silicon dioxide ($SiO_2$) and the like. In the second insulating film 4, there is formed a through hole or an opening 20.

The MIM capacitor according to the present embodiment further comprises a capacitor dielectric film or a capacitor insulating film 5 and an upper electrode 6 which are sequentially formed on a portion of the lower electrode 3 exposed via the opening 20 of the second insulating film 4. The upper electrode 6 is made, for example, of a polysilicon film. The MIM capacitor according to the present embodiment further comprises a third insulating film 7 formed on the semiconductor substrate including the first insulating film 2, the second insulating film 4 and the upper electrode 6. The third insulating film 7 is made, for example, of tetraethoxyorthosilicate (TEOS) and the like. Also, there is formed an opening 30 which penetrates the second and third insulating films 4 and 7 and which reaches the lower electrode 3. Further, there is formed an opening 40 which penetrates the third insulating film 7 and which reaches the upper electrode 6.

The MIM capacitor according to the present embodiment further comprises a first lead electrode 8 which is formed on the third insulating film 7 and which fills the opening 30, and a second lead electrode 9 which is formed on the third insulating film 7 and which fills the opening 40. The first lead electrode 8 electrically connects to the lower electrode 3 via the opening 30, and the second lead electrode 9 electrically connects to the upper electrode 6 via the opening 40. Thereby, the first lead electrode 8 and the lower electrode 3 is electrically coupled via a contact portion 10a, and the seocond lead electrode 9 and the upper electrode 6 is electrically coupled via a contact portion 10b.

Figure 2:
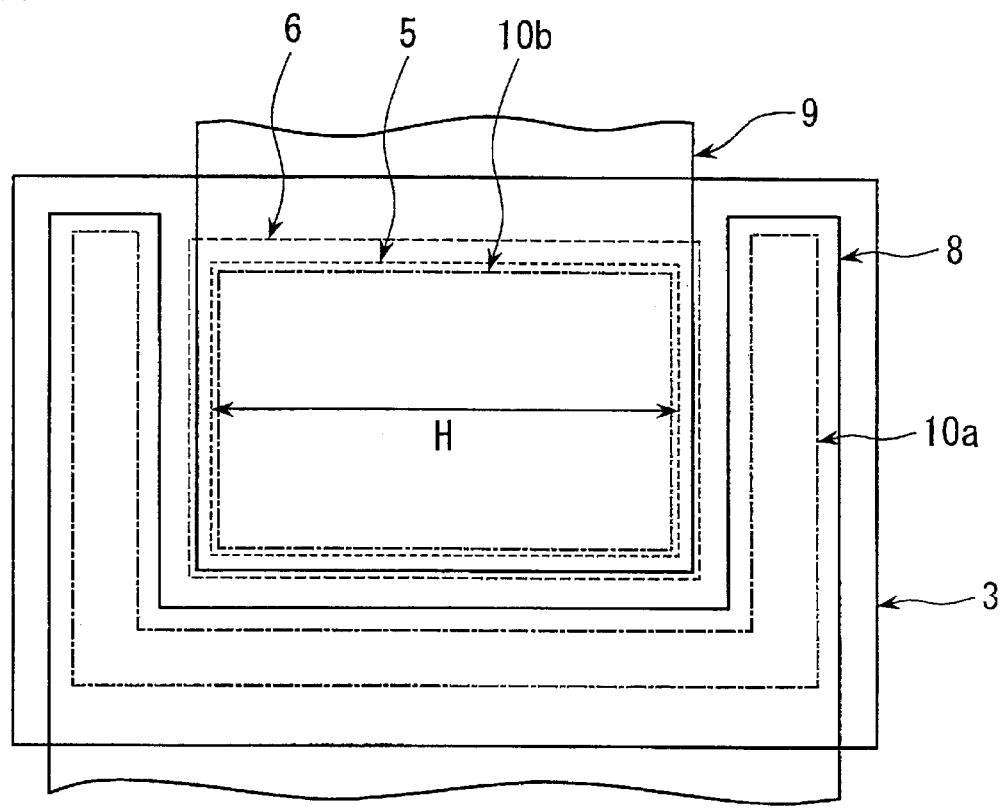
FIG. 2 is a schematic plan view showing an arrangement of components of the MIM capacitor of FIG. 1.

FIG. 2 is a schematic plan view showing an arrangement of components of the MIM capacitor of FIG. 1. As shown in FIG. 2, in the MIM capacitor according to the present embodiment, the first lead electrode 8 is continuously formed around and adjacent three sides of the capacitor insulating film 5. In this embodiment, the capacitor insulating film 5 has a rectangular shape, and a lateral width H of the capacitor insulating film 5 satisfies the following formula.

$$H < (A/F)^{1/2}$$

where, A designates a constant determined depending on a structure, material and manufacturing process of the capacitor such that a desired admittance characteristic is obtained, and F designates a maximum frequency used.

The polysilicon film as the lower electrode 3 is ion implanted by impurity ions, such as boron, phosphorus, arsenic and the like to lower electrical resistance, after forming the polysilicon film on the first insulating film 2.

The first and second lead electrodes 8 and 9 are made of metal material or materials, for example, aluminum (Al), copper (Cu), gold (Au) and the like. The capacitor insulating film 5 is made of dielectric material, for example, silicon dioxide ($SiO_2$), silicon oxynitride (SiON), silicon nitride (SiN), high dielectric constant materials and the like. The high dielectric constant materials may include PZT ($PbZr_{1-x}Ti_xO_3$: $0 \leq x \leq 1$), PLZT ($Pb_{1-x}La_xZr_{1-y}Ti_yO_3$: $0 \leq x \leq 1$, $0 \leq y \leq 1$), BTO ($BaTiO_3$), BST ($Ba_{1-x}Sr_xTiO_3$: $0 \leq x \leq 1$), STO ($SrTiO_3$) and the like.

Next, with reference to FIG. 1, an explanation will be made on a method of manufacturing the MIM capacitor of the first embodiment having the above-mentioned structure.

First, a semiconductor substrate 1 made of a P-type silicon substrate is prepared. On the semiconductor substrate 1, a first insulating film 2 made of silicon dioxide ($SiO_2$) is then formed. The thickness of the first insulating film 2 is, for example, 200–1000 nm (nanometers). Then, a polysilicon film which is to be a lower electrode 3 is grown on the first insulating film 2. The thickness of the polysilicon film is, for example, 300–500 nm. Then, in order to lower electrical resistance of the polysilicon film, impurity ions, such as boron, phosphorus, arsenic and the like are ion implanted. In this case, it is possible to form the polysilicon film to be the lower electrode 3 as a film common to a layer of a base lead portion of an NPN type or PNP type transistor not shown in the drawing.

A second insulating film 4 made of silicon dioxide ($SiO_2$) is then formed on the lower electrode 3 made of the polysilicon film. The thickness of the second insulating film 4 is, for example, 200–300 nm. By using a photo resist mask not shown in the drawing as an etching mask, a portion of the second insulating film 4 corresponding to a capacitor portion is removed by etching to form an opening 20.

On the portion of the lower electrode 3 exposed via the opening 20, a capacitor insulating film 5, for example, of a silicon nitride (SiN) film, and a polysilicon film to be an upper electrode 6 are sequentially grown. The thickness of the capacitor insulating film 5 is, for example, approximately 100 nm. The thickness of the polysilicon film to be the upper electrode 6 is, for example, 300–500 nm. In this case, materials of the capacitor insulating film 5 can be any materials selected depending on a combination of a withstanding voltage, dielectric constant and the like required by a circuit which uses the capacitor. In addition to the above-mentioned silicon nitride, the materials of the capacitor insulating film 5 can be silicon dioxide ($SiO_2$), silicon oxynitride (SiON), high dielectric constant materials and the like. The high dielectric constant materials may include PZT ($PbZr_{1-x}Ti_xO_3$: $0 \leq x \leq 1$), PLZT ($Pb_{1-x}La_xZr_{1-y}Ti_yO_3$: $0 \leq x \leq 1$, $0 \leq y \leq 1$), BTO ($BaTiO_3$), BST ($Ba_{1-x}Sr_xTiO_3$: $0 \leq x \leq 1$), STO ($SrTiO_3$) and the like.

The polysilicon film to be the upper electrode 6 is then patterned by etching. Thereby, the upper electrode 6 is formed. A third insulating film 7 is then formed on whole area of the substrate. A material for the third insulating film 7 is, for example, tetraethoxyorthosilicate (TEOS). The thickness of the third insulating film 7 is, for example, approximately 1000 nm. Then, openings 30 and 40 reaching respectively to the surfaces of the lower electrode 3 and the upper electrode 6 are formed by etching. Here, the opening 30 is formed by selectively removing the second insulating film 4 and the third insulating film 7 by etching, and the opening 40 is formed by selectively removing the third insulating film 7 by etching.

A conductive film made of aluminum (Al), copper (Cu), gold (Au) and the like is formed on the third insulating film 7 such that the openings 30 and 40 are filled with the conductive material of the conductive film. The conductive film is patterned to form the first lead electrode 8 and the second lead electrode 9 which are the lead electrodes for the lower electrode 3 and the upper electrode 6, respectively. In this way, the MIM capacitor according to the present embodiment is completed.

In this embodiment, as shown in FIG. 2, the opening 30 is formed as an approximately U-shaped opening so that the first lead electrode 8 surrounds the three sides of the capacitor insulating film 5. Also, in this embodiment, the opening 20 is formed such that the width H (see FIG. 2) of the capacitor insulating film 5 satisfies the following formula or inequality.

$$H < (A/F)^{1/2}$$

where, A designates a constant determined depending on a structure, material and manufacturing process of the capacitor such that a desired admittance characteristic is obtained, and F designates a maximum frequency used.

Figure 3:
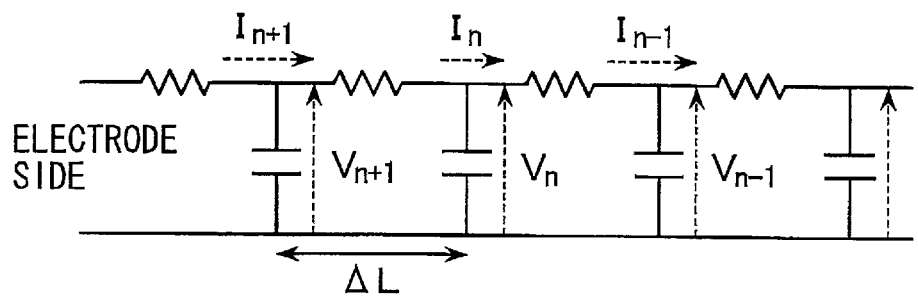
FIG. 3 is a circuit diagram showing a schematic equivalent circuit of the MIM capacitor for a semiconductor integrated circuit device of FIGS. 1 and 2.

FIG. 3 is a circuit diagram showing a schematic equivalent circuit of the MIM capacitor for a semiconductor integrated circuit device of FIGS. 1 and 2. That is, in a high frequency, an equivalent circuit of the MIM capacitor of FIGS. 1 and 2 can be represented by using a distributed parameter circuit model shown in FIG. 3.

From the distributed parameter circuit model of FIG. 3, it is possible to derive the above-mentioned formula showing a relationship between the width (H) of the capacitor and the frequency (F) actually used. The value of A in the above formula is determined depending on a parasitic resistance of the capacitance, thickness and dielectric constant of the capacitor insulating film 5, and the like. In practice, the value of A is determined by experiment, simulative calculation and the like. One exemplary way of determining the value of A is as follows.

First, the MIM capacitors having various widths H of the capacitor insulating films are actually fabricated or simulated according to the above-mentioned structure, material and manufacturing process. Then, at a predetermined frequency $F_0$ and for various values of H, difference or deviation values are calculated between the capacitance values determined by the distributed parameter circuit model and the capacitance values determined by the lumped constant circuit model approximating the capacitor. Alternatively, at a predetermined frequency $F_0$ and for various values of H, difference or deviation values are measured between the capacitance values actually measured and the capacitance values determined by the lumped constant circuit model approximating the capacitor. Then, at that frequency $F_0$, the width $H_0$ of the capacitor insulating film is obtained at which a predetermined admittance characteristic is obtained. The predetermined admittance characteristic is, for example, the characteristic corresponding to a capacitance difference of 4%, or a phase rotation of 1 degree.

Thereafter, by changing the frequency $F_0$ to various values, and, for various frequencies $F_0$, the widths $H_0$ of the capacitor insulating film are calculated or measured in which the above-mentioned predetermined admittance characteristic is obtained. The value of A is obtained from these data and an approximate formula $F_0=A/(H_0 \times H_0)$. In the MIM capacitor according to the present invention, the capacitor insulating film is formed such that the width H of the capacitor insulating film satisfies the above-mentioned inequality. Therefore, it is possible to keep the capacitance error and the phase rotation to predetermined values or below within a signal frequency range used by the MIM capacitor. That is, even at the maximum frequency F used by the MIM capacitor, it is possible to keep the capacitance error and the phase rotation to values equal to or lower than predetermined values, for example, 4% in the capacitance error and 1 degree in the phase rotation.

Figure 4:
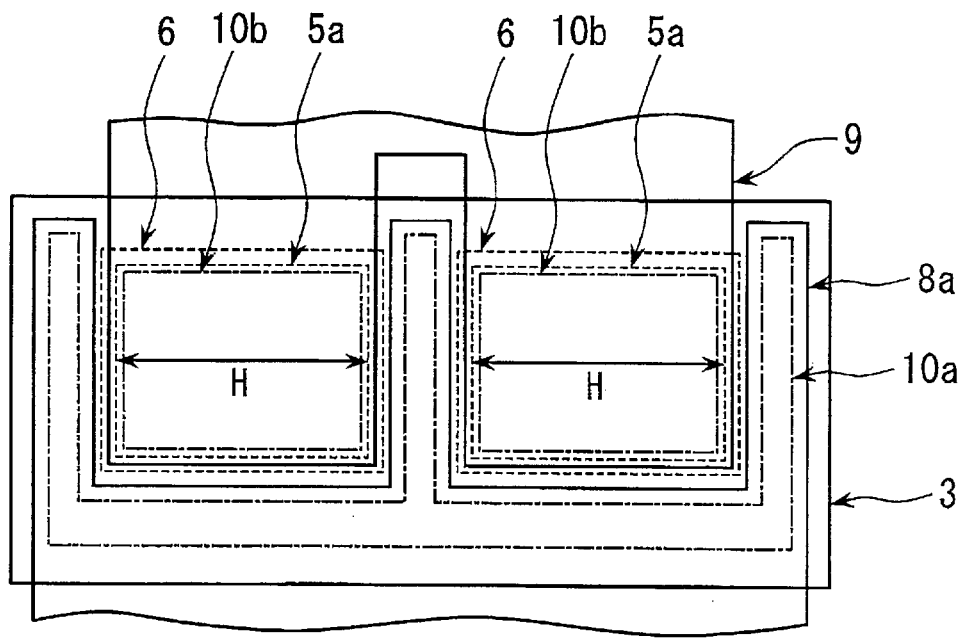
FIG. 4 is a schematic plan view showing an arrangement of components of the MIM capacitor for semiconductor integrated circuit device according to the second embodiment of the present invention.

With reference to the plan view of FIG. 4, an explanation will be made on a MIM capacitor according to the second embodiment of the present invention. FIG. 4 schematically shows an arrangement of components of the MIM capacitor according to the second embodiment. FIG. 4 corresponds to FIG. 2 in the first embodiment. In FIG. 4 showing the second embodiment, like reference numerals are used to designate identical or corresponding parts to those of FIG. 2 showing the first embodiment.

As shown in FIG. 4, in the second embodiment, in place of the capacitor insulating film 5 of the first embodiment, two capacitor insulating films 5a each having a width H are laterally disposed on the lower electrode 3. The width H of each of the capacitor insulating films 5a is selected such that the inequality with the maximum frequency F shown in the above description of the first embodiment is satisfied. Also, in place of the first lead electrode 8 of the first embodiment, a first lead electrode 8a is used which has a comb shape as shown in FIG. 4. Structure of other portions of the MIM capacitor according to the second embodiment may be the same as that of the MIM capacitor according to the first embodiment, and detailed explanation thereof is omitted here.

Also, the MIM capacitor according to the second embodiment can be fabricated by a manufacturing method similar to that of the first embodiment, and an explanation thereof is omitted here.

In the MIM capacitors according to the first and second embodiments mentioned above, error of circuit parameters, such as capacitance, phase rotation and the like, can be reduced, and it is possible to realize a semiconductor integrated circuit device having improved high frequency characteristics.

Figure 5A:
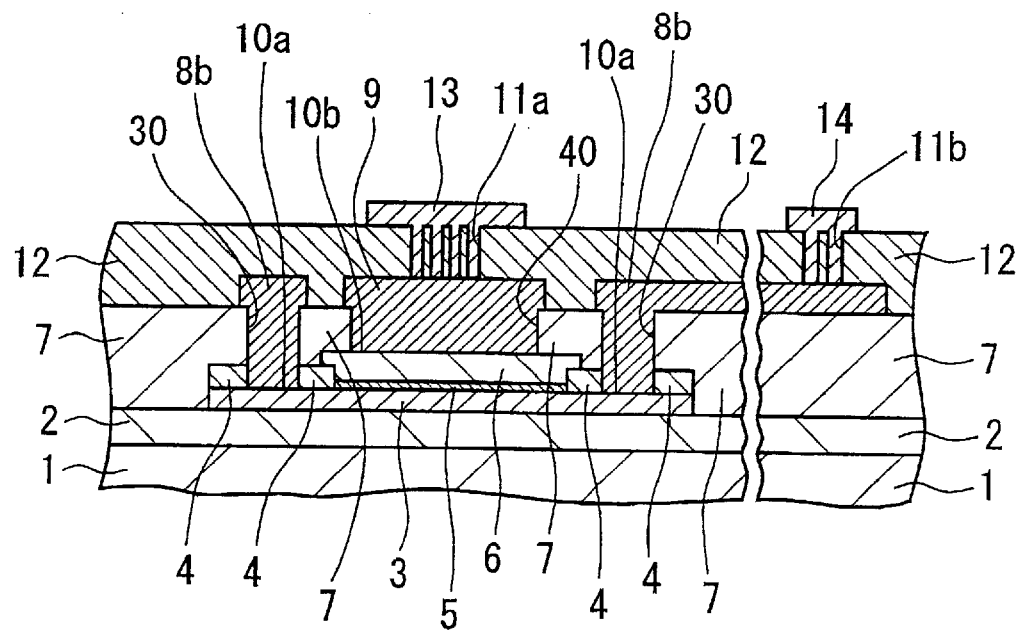
FIG. 5A is a schematic cross sectional view showing a structure of an MIM capacitor for a semiconductor integrated circuit device according to the third embodiment of the present invention.
Figure 5B:
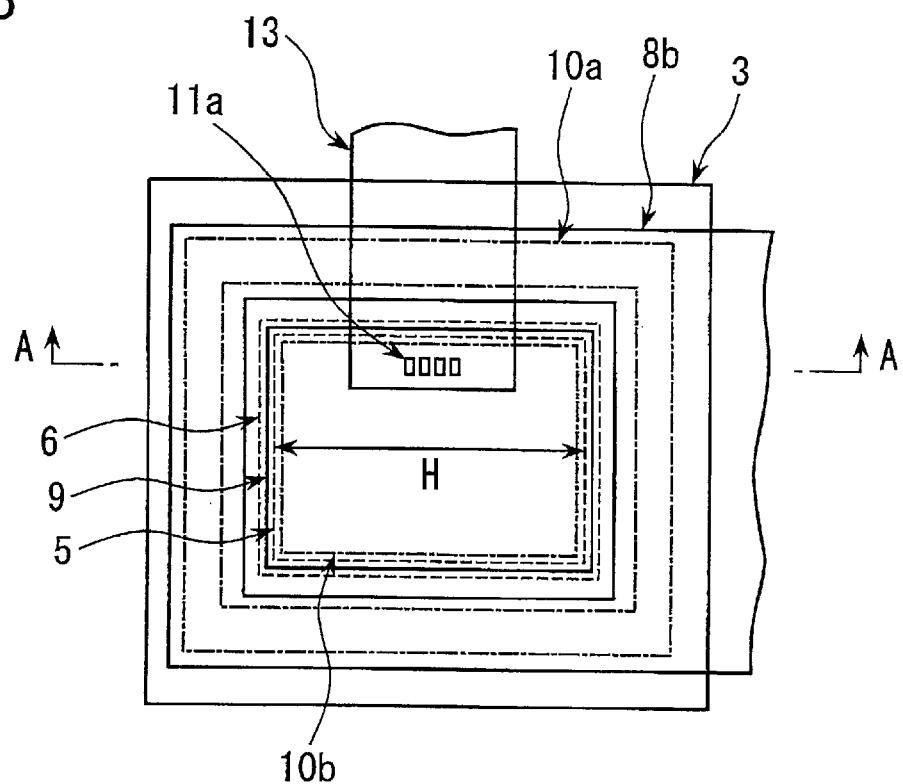
FIG. 5B is a schematic plan view showing an arrangement of components of the MIM capacitor of FIG. 5A.

With reference to the drawings, an explanation will now be made on a MIM capacitor according to the third embodiment of the present invention. FIG. 5A is a schematic cross sectional view showing a structure of an MIM capacitor according to the third embodiment of the present invention. FIG. 5B is a schematic plan view showing an arrangement of components of the MIM capacitor of FIG. 5A. FIG. 5A corresponds to a cross sectional view taken along the line A—A of FIG. 5B. Also, FIG. 5A corresponds to FIG. 1 of the first embodiment, and FIG. 5B corresponds to FIG. 2 of the first embodiment. In FIGS. 5A and 5B showing the third embodiment, like reference numerals are used to designate identical or corresponding parts to those of FIGS. 1 and 2 showing the first embodiment.

In the above-mentioned MIM capacitors according to the first and second embodiments, the first lead electrodes 8 and 8a are the U shaped electrode and the comb shaped electrode, respectively, as shown in FIG. 2 and FIG. 4. On the other hand, in the MIM capacitor according to the third embodiment, a first lead electrode 8b is formed such that it surrounds the capacitor insulating film 5 completely from four sides thereof, as shown in FIGS. 5A and 5B. By this structure, in the third embodiment, it is possible to further improve high frequency characteristics of the MIM capacitor, when compared with those of the MIM capacitors according to the first and second embodiments.

Further, in the third embodiment, a fourth insulating film 12 is formed on a third insulating film 7 so as to cover the first lead electrode 8b and a second lead electrode 9. As a material of the fourth insulating film 12, tetraethoxyorthosilicate (TEOS) is used, for example. Also, there are formed an opening 11a which penetrates the fourth insulating film 12 and reaches the second lead electrode 9, and an opening 11b which penetrates the fourth insulating film 12 and reaches the first lead electrode 8b.

A third lead electrode 13 is formed on the fourth insulating film 12 such that the material of the third electrode 13 also fills the opening 11a. A fourth lead electrode 14 is formed on the fourth insulating film 12 such that the material of the fourth electrode 14 also fills the opening 11b. The third lead electrode 13 electrically connects with the second lead electrode 9 via the opening 11a. The fourth lead electrode 14 electrically connects with the first lead electrode 8b via the opening 11b.

Therefore, the upper electrode 6 is drawn out onto the fourth insulating film 12 via the second and third lead electrodes 9 and 13. The lower electrode 3 is drawn out onto the fourth insulating film 12 via the first and fourth lead electrodes 8b and 14. By this structure, it is possible to avoid short circuit between the lead electrodes. In the plan view of FIG. 5B, illustration of the fourth lead electrode 14 and the opening 11b is omitted for the sake of simplicity.

As materials of the third and fourth lead electrodes 13 and 14, metal materials such as aluminum (Al), copper (Cu), gold (Au) and the like can be used, similarly to the materials of the first and second lead electrodes 8 and 9. The other structure and manufacturing process may be substantially the same as those of the first embodiment mentioned above, and detailed description thereof is omitted here.

As mentioned above, according to the present invention, the lead electrode of the lower electrode of the MIM capacitor is formed such that the lead electrode of the lower electrode surrounds at least three sides of the capacitor insulating film, and the width of the capacitor insulating film is determined depending on the signal frequency which is used by the MIM capacitor. Therefore, it is possible to decrease parasitic resistance of the lead portion of the MIM capacitor, and to avoid reduction of admittance in a high frequency. Also, capacitance error and phase rotation in a high frequency can be reduced. It is possible to easily and correctly design and fabricate the MIM capacitor for use in a high frequency. Further, when compared with the conventional MOS capacitor and the conventional MIM capacitor, according to the MIM capacitor of the present invention, it is possible to decrease declination of circuit parameters and to improve performance of a semiconductor integrated circuit device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. An MIM capacitor for a semiconductor integrated circuit device comprising:
    a semiconductor substrate;
    a first insulating film formed on said semiconductor substrate;
    a lower electrode formed on said first insulating film;
    a second insulating film formed on said lower electrode;
    a first opening which penetrates said second insulating film and which reaches said lower electrode;
    a capacitor insulating film formed on a portion of said lower electrode exposed by said first opening;
    an upper electrode formed on said capacitor insulating film;
    a third insulating film formed on said second insulating film and said upper electrode;
    a second opening which penetrates said second and third insulating films and which reaches said lower electrode;
    a first lead electrode which fills said second opening, which connects to a portion of said lower electrode exposed via said second opening, and which is drawn out onto the surface of said third insulating film;
    a third opening which penetrates said third insulating films and which reaches said upper electrode; and
    a second lead electrode which fills said third opening, which connects to a portion of said upper electrode exposed via said third opening, and which is drawn out onto the surface of said third insulating film;
    wherein first lead electrode is continuously formed such that said first electrode surrounds at least three sides of said capacitor insulating film, and the width of said capacitor insulating film satisfies the following formula:

$$H<(A/F)^{1/2}$$

where, H designates the width of said capacitor insulating film, A designates a predetermined constant determined depending on a structure and a manufacturing process of said MIM capacitor to obtain desired admittance characteristics, and F designates maximum frequency of a signal used by said MIM capacitor.

2. An MIM capacitor for a semiconductor integrated circuit device as set forth in claim 1, wherein said first lead electrode is a U-shaped electrode.

3. An MIM capacitor for a semiconductor integrated circuit device as set forth in claim 1, wherein said first lead electrode is a comb-shaped electrode.

4. An MIM capacitor for a semiconductor integrated circuit device as set forth in claim 1, wherein said first lead electrode is continuously formed such that said first lead electrode surrounds all sides of said capacitor insulating film.

5. An MIM capacitor for a semiconductor integrated circuit device as set forth in claim 1, wherein said capacitor insulating film is made of a material selected from a group consisting of silicon oxide, silicon oxynitride and silicon nitride.

6. An MIM capacitor for a semiconductor integrated circuit device as set forth in claim 1, wherein said capacitor insulating film is made of a high dielectric constant material.

7. An MIM capacitor for a semiconductor integrated circuit device as set forth in claim 1, wherein said capacitor insulating film is made of a material selected from a group consisting of $PbZr_{1-x}Ti_xO_3$ ($0 \leq x \leq 1$), $Pb_{1-x}La_xZr_{1-y}Ti_yO_3$ ($0 \leq x \leq 1$, $0 \leq y \leq 1$), $BaTiO_3$, $Ba_{1-x}Sr_xTiO_3$ ($0 \leq x \leq 1$), and $SrTiO_3$.

8. An MIM capacitor for a semiconductor integrated circuit device as set forth in claim 1, wherein said lower electrode and said upper electrode are made of polysilicon.

9. An MIM capacitor for a semiconductor integrated circuit device as set forth in claim 1, wherein said first and second lead electrodes are made of a material selected from a group consisting of aluminum, copper and gold.

10. An MIM capacitor for a semiconductor integrated circuit device as set forth in claim 1, wherein said first and second insulating films are made of silicon oxide, and said third insulating film is made of tetraethoxyorthosilicate.

* * * * *